(12) United States Patent
Ettelt et al.

(10) Patent No.: US 8,653,813 B2
(45) Date of Patent: Feb. 18, 2014

(54) MAGNETIC FIELD VECTOR SENSOR

(71) Applicants: Dirk Ettelt, Gelsenkirchen (DE); Jerome Delamare, Grenoble (FR); Gor Lebedev, Grenoble (FR); Bernard Viala, Sassenage (FR)

(72) Inventors: Dirk Ettelt, Gelsenkirchen (DE); Jerome Delamare, Grenoble (FR); Gor Lebedev, Grenoble (FR); Bernard Viala, Sassenage (FR)

(73) Assignees: Commissariat a l'Energie Atomique et aux Energies Alternatives, Paris (FR); Institut Polytechnique de Grenoble, Grenoble (FR)

( * ) Notice: Subject to any disclaimer, the term of this patent is extended or adjusted under 35 U.S.C. 154(b) by 0 days.

(21) Appl. No.: 13/676,752

(22) Filed: Nov. 14, 2012

(65) Prior Publication Data

US 2013/0127455 A1 May 23, 2013

(30) Foreign Application Priority Data

Nov. 14, 2011 (FR) ..................................... 11 60325

(51) Int. Cl.
*G01R 33/02* (2006.01)
(52) U.S. Cl.
USPC ........................... 324/244; 324/252; 324/260
(58) Field of Classification Search
USPC .......... 324/344, 247, 252, 257–259, 260, 262
See application file for complete search history.

(56) References Cited

U.S. PATENT DOCUMENTS

| | | | |
|---|---|---|---|
| 6,664,786 B2 * | 12/2003 | Kretschmann et al. | 324/259 |
| 8,159,218 B2 * | 4/2012 | Bolle | 324/244 |
| 2011/0140693 A1 | 6/2011 | Baldo et al. | |
| 2012/0176128 A1 * | 7/2012 | Seeger et al. | 324/244 |

OTHER PUBLICATIONS

Thompson et al. "Low Power 3-Axis Lorentz Force Navigation Magnetometer" *IEEE MEMS*, pp. 593-596 (2011).
Kyynarainen et al. "A 3D micromechanical compass" *Sensors and Actuators A 142*, pp. 561-568 (2008).
Geoffroy et al. "Practical and Theoretical Investigations of a Rotating Coilless Actuator Using the Inverse Magnetostrictive Effect" *IEEE Transactions on Magnetics*, 46(2): pp. 606-609 (Feb. 2010).
Dumas-Bouchiat et al. "Thermomagnetically Patterned Micromagnets" *Applied Physics Letters*, 96: pp. 102511-1 to 102511-3 (2010).
Arnold et al. "Permanent Magnets for MEMS" *Journal of Microelectromechanical Systems*, 18(6): 1255-1266 (Dec. 2009).
Ettelt et al. "A New Low Consumption 3D Compass Using Integrated Magnets and Piezoresistive Nano-Gauges" *International Conference on Solid State Sensors and Actuators (Transducers)*, pp. 40-43 (2011).
Ettelt et al. "A Novel Microfabricated High Precision Vector Magnetometer" *IEEE Sensors*, pp. 2010-2013 (2011).

* cited by examiner

*Primary Examiner* — Arleen M Vazquez
(74) *Attorney, Agent, or Firm* — Occhiuti & Rohlicek LLP

(57) ABSTRACT

A magnetic field vector sensor includes a substrate parallel to a plane, a support mobile relative to it and rotatable about a vertical rotation axis perpendicular to it, a magnetic field source generating a field having a moment in a non-perpendicular direction, the source being fixed to the support with no degree-of-freedom to exert torque on the support when a field to be measured is present, the field being non-collinear with the moment, a transducer to convert torque exerted on the support into a field amplitude of a component of the field along a measurement axis in the plane, wherein the source comprises a magnetostrictive permanent magnet for generating the field having a moment whose direction varies with stress on the magnet, and wherein the sensor further comprises a controllable device to reversibly modify the moment direction, and a stress generator to vary stress and hence moment direction.

10 Claims, 4 Drawing Sheets

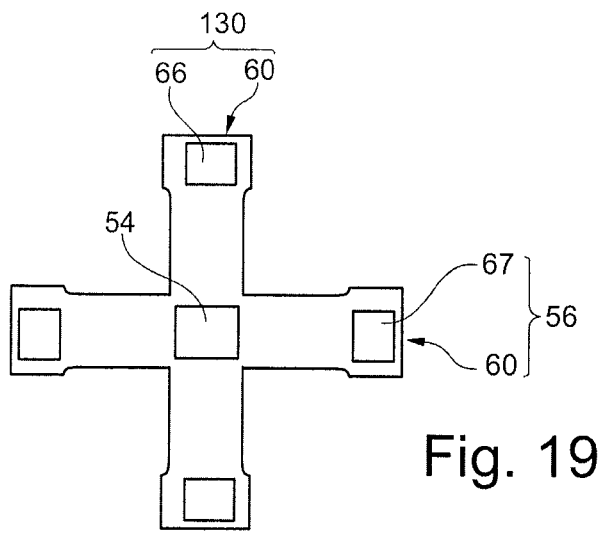
Fig. 19
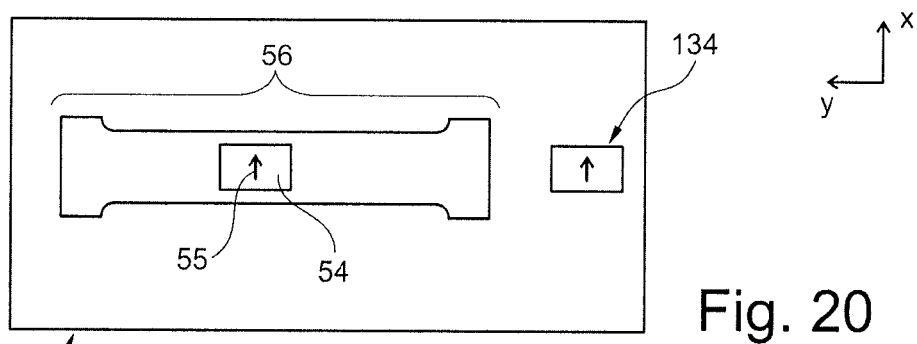
Fig. 20
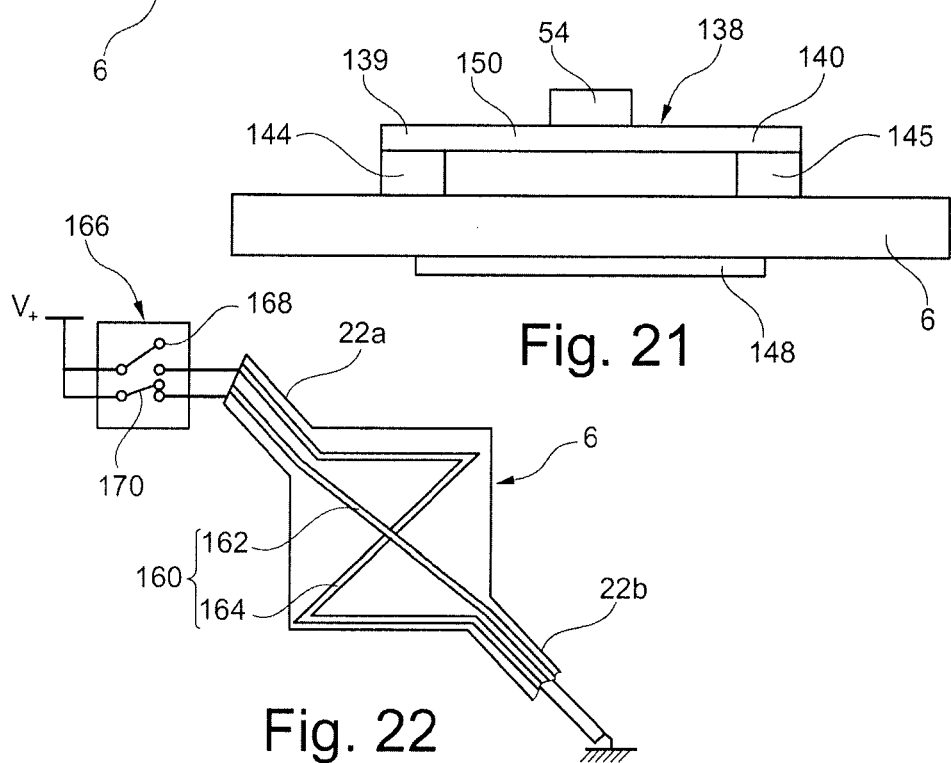
Fig. 21
Fig. 22

MAGNETIC FIELD VECTOR SENSOR

RELATED APPLICATIONS

Under 35 USC 119, this application claims the benefit of the priority date of French Patent Application 1160325, filed Nov. 14, 2011, the contents of which are herein incorporated by reference.

FIELD OF DISCLOSURE

The invention concerns a magnetic field vector sensor and a method of measuring a magnetic field using that sensor.

BACKGROUND

A vector sensor is a sensor that enables measurement of the components of a magnetic field to be measured in a frame of reference with two or three dimensions. Here, in a frame of reference with two dimensions, these components are denoted $c_X$ and $c_Y$. In a frame of reference with three dimensions, these components are denoted $c_X$, $c_Y$ and $c_Z$. A vector sensor thus enables measurement of the direction, and preferably also of the amplitude, of the magnetic field. The components $c_X$, $c_Y$ and $c_Z$ correspond to the orthogonal projection of the magnetic field to be measured onto the axes X, Y and Z, respectively, of the frame of reference.

Known magnetic field vector sensors include:
a fixed substrate extending essentially parallel to a plane called the "substrate plane",
a support mobile relative to the substrate rotatable about at least a vertical rotation axis Z perpendicular to the substrate plane,
a magnetic field source having a magnetic moment in a direction that is not perpendicular to the substrate plane, this source being fixed to the mobile support with no degree of freedom so as to exert a mechanical torque on the support about the vertical rotation axis in the presence of a magnetic field to be measured that is not colinear with the direction of this magnetic moment,
at least one transducer adapted to convert the torque exerted on the mobile support about the rotation axis into an electrical signal representative of the amplitude of a component of the magnetic field to be measured along a measurement axis contained in the substrate plane.

When the magnetic field source is immersed in the magnetic field to be measured, a torque $\Gamma$ appears that is a function of the magnetic moment of the source, the amplitude of the magnetic field to be measured and the angle between the magnetic moment of the source and the direction of the magnetic field to be measured. This torque $\Gamma$ tends to cause the mobile support to turn so that the direction of the magnetic moment of the source is aligned with the direction of the magnetic field to be measured. A torque is therefore exerted on the mobile support. This torque, or a magnitude representative of this torque, such as an angular displacement, is measured by the transducers.

However, to determine unambiguously the components $c_X$ and $c_Y$ of the magnetic field to be measured contained in the substrate plane of the sensor, at least two magnetic field sources are necessarily required the magnetic moments of which are aligned in two different directions. Consequently, the known sensors include at least one first mobile support and one second mobile support each carrying a respective one of these magnetic field sources.

The presence of a plurality of mobile supports and a plurality of magnetic field sources gives rise to the following problems in particular:
it increases the overall size of the sensor,
it can cause measurement errors from one sensor to another because it is difficult to position the magnetic field sources in each sensor and to orient them precisely with respect to each other in exactly the same manner, and
magnetic coupling may exist between the different magnetic field sources, which introduces a skew into the measurement.

The prior art also includes US2011/0140693A1 and the paper by Dirk Ettelt et al, "A novel Microfabricated High Precision Vector Magnetometer", 2011 IEEE Sensors Proceedings: Limerick, Ireland, 28-31 Oct. 2011, pages 2010-2013.

SUMMARY

The invention aims to remedy at least one of these drawbacks. It therefore consists in a magnetic field vector sensor according to claim 1.

Being able to modify the direction of the magnetic moment of the magnetic field source enables the use of only one magnetic field source to measure the components $c_X$ and $c_Y$. The overall size of this sensor is therefore limited because only one magnetic field generator is used to measure the two components $c_X$ and $c_Y$. Moreover, the problems with positioning the different magnetic field sources relative to each other are eliminated. The risk of magnetic coupling between these different magnetic field sources is also eliminated because only one magnetic field source is used.

Embodiments of this sensor may have one or more of the features of the dependent claims.

These embodiments of the sensor also have the following advantages:
using a permanent magnet, constituted of a one-piece material or a stack of antiferromagnetic/ferromagnetic layers with a non-zero overall remnant magnetization enables the electrical power consumption of the sensor to be reduced,
orienting the direction of the magnetic moment of the magnetic field source parallel or perpendicular to the stretching direction according to the value of the magnetostriction coefficient $\lambda_s$ enables the sensitivity of the sensor to be increased,
using a beam the ends at least of which are of piezoelectric material enables a uniaxial stress to be applied to the permanent magnet in a simple and controlled manner,
using as the magnetic field source first and second electrical conductors extending in respective directions enables simple control of the intensity of the magnetic moment generated by the source as well as its direction,
using a frame connected to the support by means of a set of beams and connected to the substrate by means of another set of beams deformable in flexing and in torsion enables simple implementation of a sensor capable of measuring the components $c_X$, $c_Y$ and $c_Z$,
alternately aligning the magnetic moment of the source with the axes X and Y of the frame of reference enables simple measurement of the components $c_X$ and $c_Y$ of the magnetic field to be measured.

The invention also consists in a method according to claim 8 of measuring a magnetic field using the above sensor.

DESCRIPTION OF THE DRAWINGS

The invention will be better understood after reading the following description, provided by way of nonlimiting example only and given with reference to the drawings, in which:

FIG. 19 is a diagrammatic illustration of a second embodiment of a stress generator that may be used in the sensor from FIG. 1, FIG. 20 is a diagrammatic illustration of another embodiment of a magnetic field source that may be used in the sensor from FIG. 1, FIG. 21 is a diagrammatic illustration in vertical section of a third embodiment of a stress generator that may be used in the sensor from FIG. 1, and FIG. 22 is a diagrammatic illustration of another embodiment of a magnetic field source that may be used in the sensor from FIG. 1.

In these figures, the same references are used to designate the same elements.

DETAILED DESCRIPTION

In the remainder of this description, features and functions well known to a person skilled in the art are not described in detail.

Figure 1:
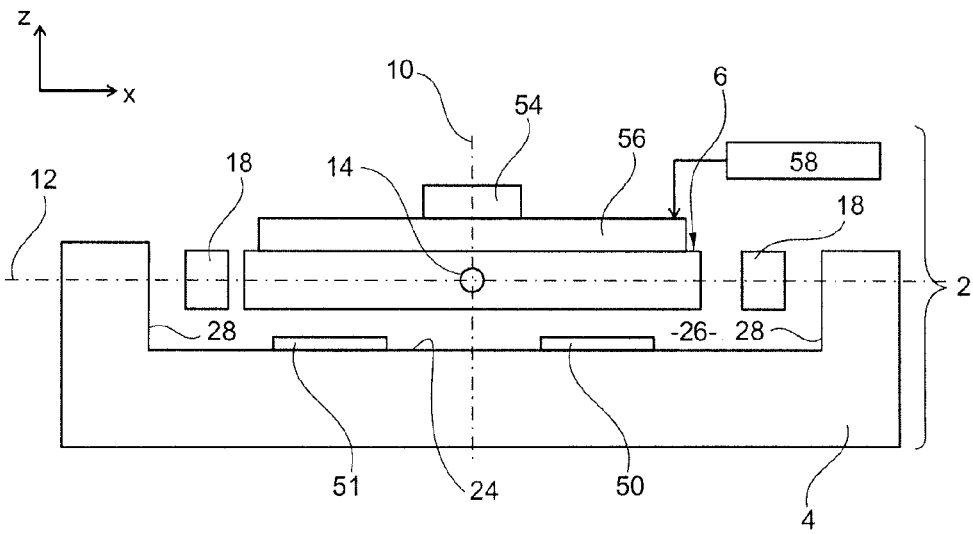
FIG. 1 is a diagrammatic illustration in vertical section of a vector sensor.
Figure 2:
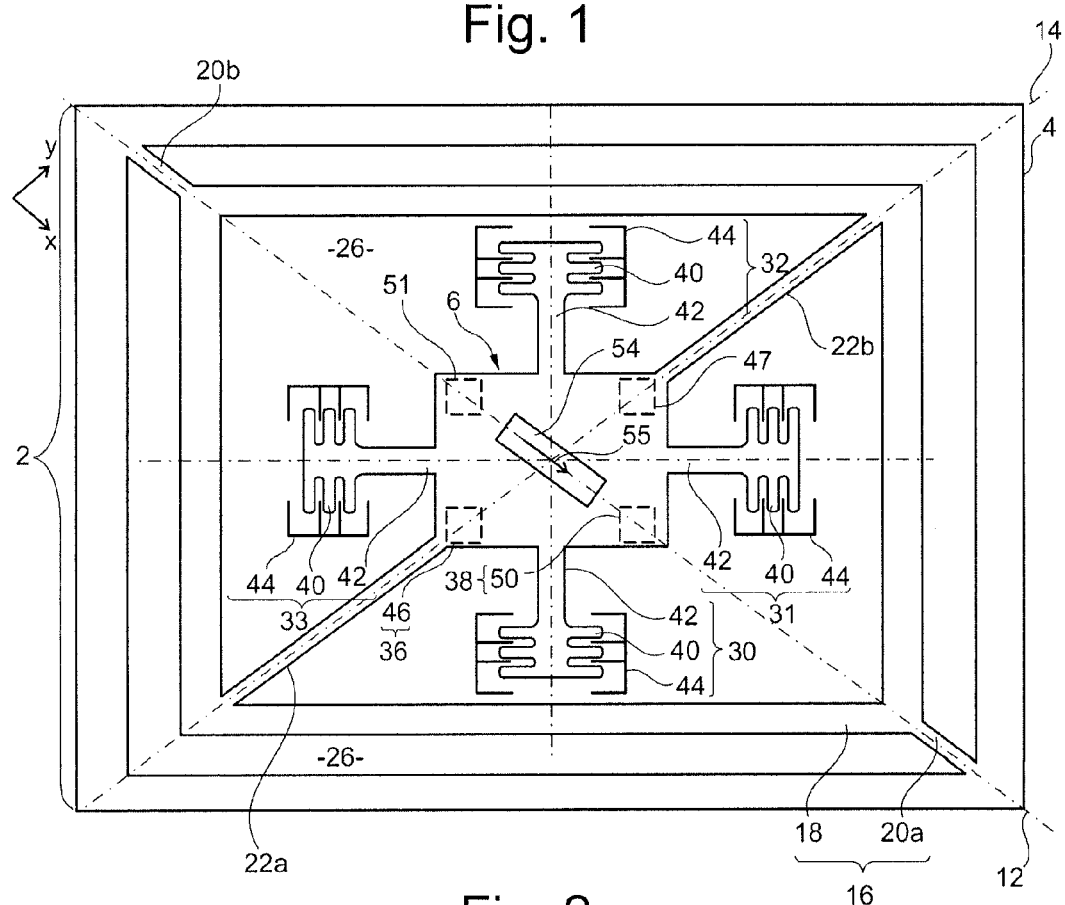
FIG. 2 is a diagrammatic illustration in plan view of the sensor from FIG. 1.

FIGS. 1 and 2 represent a magnetic field vector sensor 2. This sensor 2 is adapted to measure the orthogonal projection of the magnetic field to be measured onto three orthogonal axes 10, 12 and 14. Here these axes are parallel to the directions X, Y and Z, respectively, of an orthogonal frame of reference. The directions X and Y are horizontal directions while the direction Z is a vertical direction. Hereinafter, terms such as "above", "below", "upper" and "lower" are defined relative to the direction Z. In FIG. 1, the axis 14 is perpendicular to the plane of the sheet. To limit the overall size of FIG. 2, it has been squeezed in one direction so that the axes 12 and 14 do not appear as being perpendicular to each other.

The sensor 2 includes a rigid substrate 4 extending essentially in a horizontal plane called the "substrate plane". The thickness in the vertical direction of this substrate 4 is typically greater than 10 μm, 50 μm or 100 μm.

The sensor 2 also includes a mobile support 6 rotatable about the axes 10, 12 and 14. Here this support has a rectangular or square horizontal section. The support 6 is mechanically connected to the substrate 4 by means of an articulated mechanism 16 (FIG. 2) enabling the support to rotate about the axes 10, 12 and 14.

Here this mechanism 16 includes:

a rigid frame 18 that is not deformed in response to the rotation of the support 6, a set of two beams 20a and 20b adapted to hold the frame 16 suspended above the substrate 4, and a set of two beams 22a and 22b adapted to hold the frame 6 suspended above the substrate 4.

Here the frame 18 is suspended over a bottom 24 (FIG. 1) of a cavity 26 hollowed out in an upper face of the substrate 4.

This cavity 26 is also delimited by vertical walls 28. By way of illustration only, the horizontal section of this cavity 26 is rectangular or square.

The cross section of the frame 18 is also rectangular or square, for example.

The frame 18 includes a rectangular or square central opening passing through it along the axis 10. The support 6 is received inside this central opening. Here the horizontal section of the support 6 is also rectangular or square.

The ends of the beams 20a and 20b are anchored with no degree of freedom, on one side, to the wall 28 and, on the opposite side, to the frame 18. These beams 20a and 20b are disposed in diametrically opposite positions on respective opposite sides of the axis 10. Here the beams 20a and 20b mechanically connect respective corners of the frame 18 and vertical walls 28 of the cavity 26. These beams 20a and 20b extend along the axis 12.

The length $L_{ext}$ along the axis 12 and the width $l_{ext}$ perpendicular to that axis of the beams 20a and 20b are chosen so as:

to enable deformation in flexing of the beam parallel to the horizontal plane so as to authorize rotation of the frame 16 about the axis 10, and to enable deformation in torsion of the beam about the axis 12 so as to authorize rotation of the frame 16 about the axis 12.

To this end, the width $l_{ext}$ is at least ten or twenty times less than the length $L_{ext}$, for example.

The thickness $e_{ext}$ of the beams 20a and 20b in the vertical direction is sufficient to maintain the frame 18, the beams 22a and 22b, and the support 6 suspended above the bottom 24. Here the thickness $e_{ext}$ is equal to the thickness of the frame 18 and the support 6. For example, this thickness $e_{ext}$ is greater than or equal to 10 μm.

The ends of the beams 22a and 22b are anchored with no degree of freedom, on one side, to the frame 18 and, on the opposite side, to the support 6. Here these beams 22a and 22b extend essentially along the axis 14. To be more precise, the beams 22a and 22b are disposed diametrically opposite each other with respect to the axis 10. Here they connect respective corners of the support 6 to facing corners of the frame 18.

The length $L_{int}$ along the axis 14 and the width $l_{int}$ perpendicular to that axis of the beams 22a and 22b are chosen so as:

to enable deformation in flexing of the beam parallel to the to the horizontal plane so as to authorize rotation of the support 6 relative to the frame 18 about the axis 10, and to enable deformation in torsion of the beam about the axis 14 so as to authorize rotation of the support 6 about the axis 14.

The thickness $e_{int}$ of the beams 22a and 22b in the direction Z is sufficient to maintain the support 6 suspended above the bottom 24.

For example, the dimensions $L_{int}$, $l_{int}$ and $e_{int}$ are chosen like the dimensions $L_{ext}$, $l_{ext}$ and $e_{ext}$, respectively.

Respective transducers are provided for measuring a physical magnitude representative of the torque exerted on the support 6 about the axes 10, 12 and 14. Here the measured physical magnitude is an angular displacement. To this end, the sensor 2 includes capacitive transducers 30 to 33 (FIG. 2) used to measure the angular displacement $\theta_Z$ of the support 6 about the axis 10 and capacitive transducers 36 and 38 used to measure the angular displacements $\theta_X$ and $\theta_Y$, respectively, about the axes 12 and 14, respectively.

Each transducer 30 to 33 is formed of:

a mobile electrode 40 mechanically connected with no degree of freedom to the support 6 by means of a rigid arm 42, and a fixed electrode 44 fixed with no degree of freedom to the substrate 4.

Here the electrodes 40 and 44 are interdigitated to increase the measurement sensitivity.

Rotation of the support 6 about the axis 10 leads to displacement of the electrode 40, which modifies the distance between the electrodes 40 and 44 and therefore the capacitance of the transducer. Thus the angle $\theta_Z$ can be measured.

The transducer 36 includes two electrodes 46 and 47 fixed with no degree of freedom to the bottom 24 below the support 6. The electrodes 46 and 47 are disposed on either side of the axis 10 along the axis 14. Here these electrodes 46, 47 are symmetrical to each other with respect to an axis corresponding to the projection of the axis 12 on the bottom 24. These electrodes 46, 47 are represented in dashed line in FIG. 2. Accordingly, if the support 6 turns about the axis 12, on one side of the axis 12, the support moves toward one of the electrodes 46 or 47 and, on the other side of the axis 12, the support 6 moves away from the other of these electrodes 46, 47. This therefore modifies the capacitor formed by the electrodes 46 and 47 with the bottom of the support 6 and thus enables the angle $\theta_X$ to be measured.

The transducer 38 is produced with the aid of two electrodes 50 and 51. These electrodes 50 and 51 are disposed as described for the transducer 36, for example, but with that description transposed for the measurement of rotation about the axis 14.

A magnetic field source 54 is fixed with no degree of freedom to the support 6. This source 54 generates a magnetic field having a magnetic moment. The direction 55 of this magnetic moment is represented by an arrow in FIG. 2.

In this particular embodiment, this source is a magnetostrictive permanent magnet with a non-zero overall remanent magnetization. In the remainder of this description, this magnet also carries the reference 54. To be more precise, it is the inverse magnetostrictive properties of this magnet that are used here, i.e. the possibility of modifying the magnetic properties of the magnet by applying mechanical stresses to it. The magnetic property of the magnet that is modified by the application of stress is the direction 55 of the magnetic moment.

In this embodiment, the permanent magnet 54 is a stack of alternating layers of ferromagnetic material and layers of antiferromagnetic material deposited directly onto the layer of ferromagnetic material. The antiferromagnetic layers serve to trap the direction of the magnetic moment of the ferromagnetic layers. The stack preferably comprises a plurality of ferromagnetic layers and a plurality of antiferromagnetic layers. Such stacks are well known for producing the trapped layer or the reference layer used in spintronics, for example, for the production of radio-frequency oscillators.

In the absence of an exterior magnetic field, this stack has a preferential direction of magnetization close to saturation, also known as the "trapping direction". For example, in the absence of any mechanical stress, this direction is aligned with the axis 12.

The ferromagnetic layer is typically produced with the aid of:
a polycrystalline alloy containing iron or iron and cobalt, possibly with one or more substitution elements such as gallium or terbium, or
an amorphous composition including iron or iron and cobalt with one or more amorphization components such as boron, nitrogen or carbon and with one or more substitution elements such as gallium or terbium (Tb).

The antiferromagnetic layer may be produced in a manganese alloy such as a PtMn, IrMn, FeMn or NiMn alloy.

Here the ferromagnetic layer is a CoFeB alloy and the antiferromagnetic layer is a PtMn alloy.

Such a stack has a positive magnetostriction coefficient $\lambda_s$ typically between 50 and 120 ppm and a coercive magnetic field between 1 and 20 Oe (one Oersted is approximately equal to 79.57 A.m$^{-1}$).

Because of the action of a uniaxial tension mechanical stress applied to the magnet 54 perpendicularly to its preferential magnetization direction, the direction 55 of its magnetic moment turns. For example, to cause the direction of the magnetic moment of the magnet 54 to turn 90°, a mechanical stress greater than 100 MPa, and preferably between 100 MPa and 1 GPa, must be applied. Moreover, all directions of the magnetic moment of this magnet 54 between 0° and 90° are stable directions, i.e. can be maintained indefinitely for as long as the corresponding mechanical stress is applied.

To modify the direction 55 of the magnetic moment, the sensor 2 includes a device 56 (FIG. 1). Here this device 56 is a mechanical stress generator. In the remainder of this description, this generator carries the same numerical reference as the device 56. The generator 56 preferably generates only a uniaxial stress perpendicular to the preferential magnetization direction of the magnet 54.

Finally, the sensor 2 includes a processing unit 58 adapted to control the generator 56 and to process the measurements from the transducers 30 to 33, 36 and 38.

Figure 3:
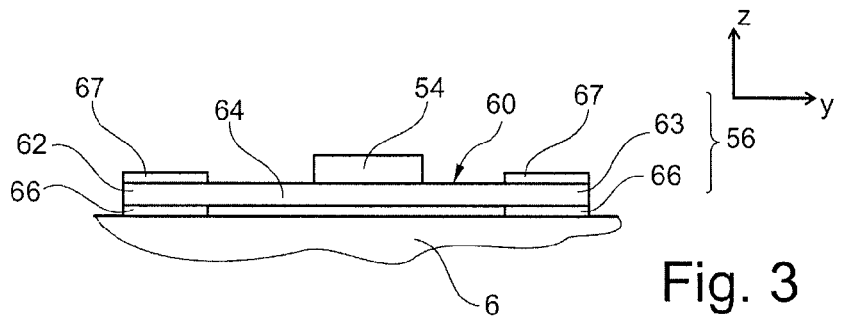
FIG. 3 is a diagrammatic illustration in vertical section of a first embodiment of a stress generator used in the sensor from FIG. 1.
Figure 4:
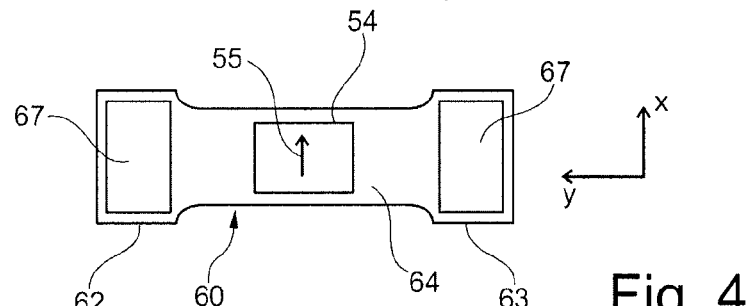
FIG. 4 is a diagrammatic illustration in plan view of the stress generator from FIG. 3.

FIGS. 3 and 4 show the generator 56 in more detail. Here the generator 56 is identical to that described in French patent application FR 2 905 793 published Mar. 14, 2008. Accordingly, only an outline description of this generator is given here. For more details, the reader may consult the French patent application FR 2 905 793.

The generator 56 includes a beam 60 each end 62, 63 of which is anchored with no degree of freedom to an upper face of the support 6. Between these ends 62, 63, the beam 60 forms a central branch 64 suspended above the upper face of the support 6.

The ends 62, 63 and preferably the central branch 64 are produced in a piezoelectric material such as PZT (lead zirconate titanate).

To actuate this piezoelectric material and to generate a uniaxial stress in the longitudinal direction of the beam, each end 62 and 63 is disposed between lower and upper control electrodes 66, 67.

The permanent magnet 54 is fixed with no degree of freedom, for example directly, to the central branch 64 so that its preferential magnetization direction is perpendicular to the longitudinal axis of the beam 60. Here the longitudinal axis of the beam 60 is parallel to the direction Y.

The uniaxial mechanical stress exerted on the magnet 54 typically increases from 1 MPa/V and preferably from at least 10 MPa/V as a function of the potential difference between the electrodes 66 and 67.

Figure 5:
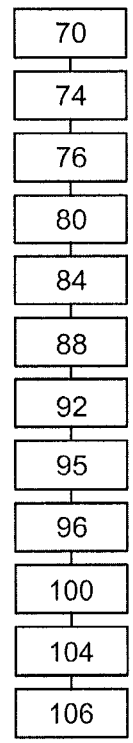
FIG. 5 is a flowchart of a method of fabricating the sensor from FIG. 1, FIGS. 6 to 17 are diagrammatic illustrations in vertical section of different steps in the fabrication of the sensor from FIG. 1.

The method of fabricating the sensor 2 will now be described with reference to the method of FIG. 5 and with the aid of FIGS. 6 to 17.

Figure 6:
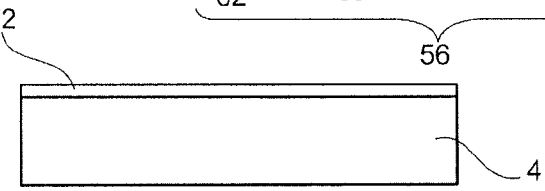

During a step 70, the substrate 4 is procured and a layer 72 of electrical insulation is deposited on its upper face (FIG. 6). The substrate 4 is typically a silicon substrate.

Figure 7:
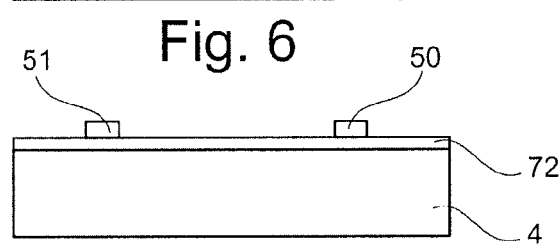

During a step 74, the electrodes 46, 47, 50 and 51 are deposited and etched on the surface of the layer 72 (FIG. 7). In FIG. 7 and the subsequent figures only the electrodes 50 and 51 can be seen.

Figure 8:
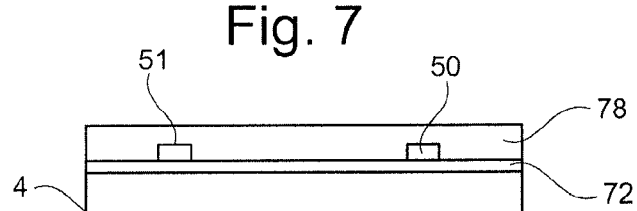

During a step 76, a sacrificial layer 78 is deposited on top of the electrodes 46, 47, 50 and 51 and then polished (FIG. 8). The sacrificial layer 78 is a silicon oxide layer, for example.

Figure 9:
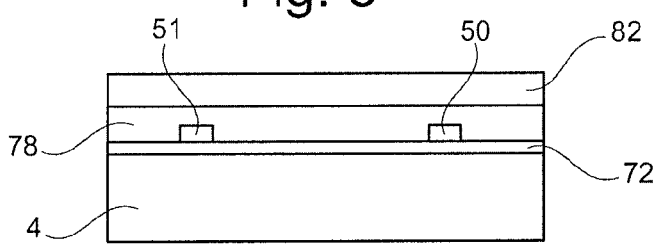

During a step 80, a silicon layer 82 is deposited on the layer 78 by an epitaxial growth process (FIG. 9). This silicon layer 82 typically has a vertical thickness greater than 10 µm.

Figure 10:
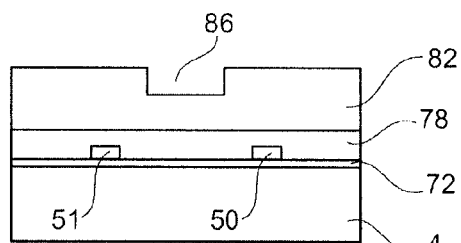

During a step 84, a cavity 86 is hollowed out substantially at the centre of the upper face of the layer 82 by photolithography and etching (FIG. 10). This cavity 86 is intended to be located under the central branch 64 of the beam 60.

Figure 11:
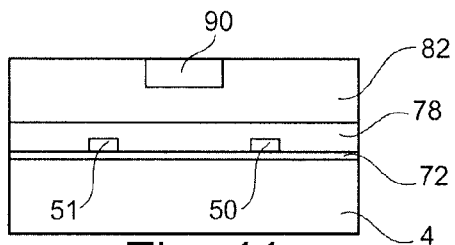

During a step 88, a sacrificial layer 90 is deposited to fill the cavity 86 (FIG. 11). This layer 90 is then polished to render the upper face plane. The sacrificial layer is of polycrystalline silicon, for example.

Figure 12:
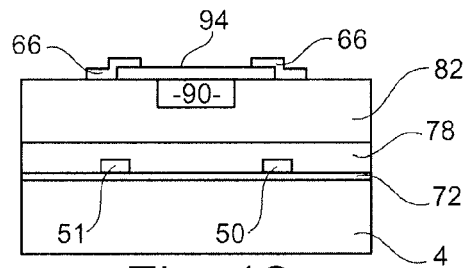

During a step 92, a layer 94 of electrical insulation is deposited on the sacrificial layer 90 (FIG. 12). During this same step, the lower electrodes 66 of the stress generator 56 are deposited and then etched on the layer 94. These electrodes are in platinum, for example.

Figure 13:
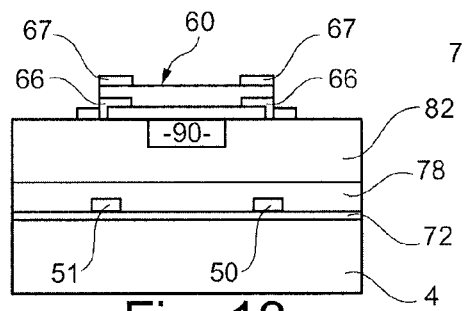

During a step 95, the piezoelectric material beam 60 is deposited and etched on the layer 94 (FIG. 13). During this step, the upper electrodes 67 of the generator 56 are also deposited and etched.

Figure 14:
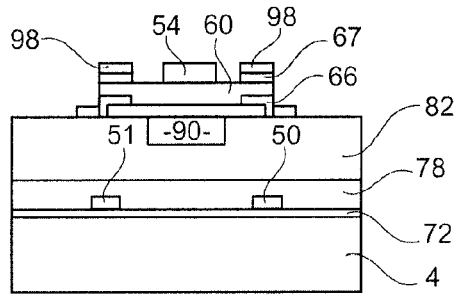

During a step 96, the permanent magnet 54 is deposited and then etched (FIG. 14). During this step 96, gold electrodes 98 are also deposited and etched on the upper electrodes 67 to enable an electrical contact to be formed on these upper electrodes.

Figure 15:
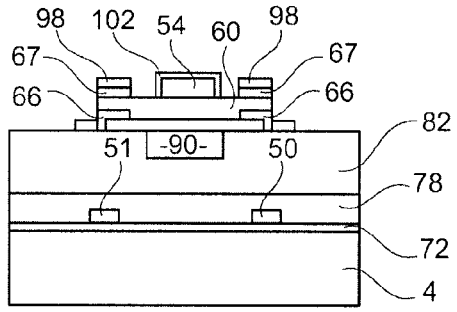

During a step 100, if necessary, a protection layer 102 is deposited and then etched to protect the magnet 54 during subsequent attacks by HF (hydrofluoric acid) vapour etching (FIG. 15).

Figure 16:
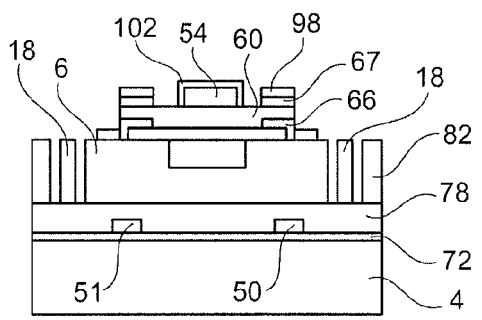
Figure 17:
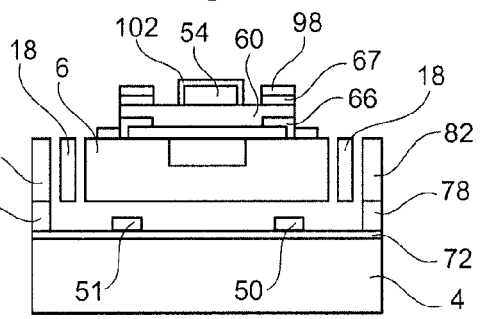

During a step 104, the support 6, the frame 18 and the beams 20*a*, 20*b*, 22*a* and 22*b* are formed in the layer 82 by photolithography followed by Deep Reactive Ion Etching (DRIE) (FIG. 16).

Finally, during a step 106, the sacrificial layers 90 and the sacrificial layer 78 situated under the support 6 are eliminated (FIG. 17) to free the mechanism 16, the support 6 and the beam 60. These sacrificial layers are typically eliminated by an HF vapour etching step.

Figure 18:
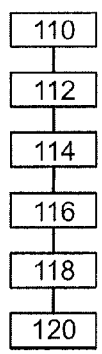
FIG. 18 is a flowchart of a method of measuring a magnetic field using the sensor from FIG. 1.

The operation of the sensor 2 will now be described with reference to the FIG. 18 method.

Initially, during a step 110, the stress generator 56 does not apply any stress to the magnet 54. The magnet 54 then generates a magnetic field the direction 55 of the magnetic moment of which is aligned with the axis 12.

During a step 112, the transducers 30 to 33 and 38 respectively measure the angles $\theta_Z$ and $\theta_Y$ of rotation about the axes 10 and 14, respectively. These angles $\theta_Z$ and $\theta_Y$ are functions of the torque exerted by the magnetic field to be measured on the magnet 54.

Then, during a step 114, the processing unit 58 samples the electrical signals generated by the transducers and then deduces from them the measured values of the angles $\theta_Z$ and $\theta_Y$.

Then, during a step 116, the processing unit 58 controls the generator 56 in such a manner as to align the direction 55 of the magnetic moment of the magnet 54 with the axis 14.

There follows a step 118 of measuring the angles $\theta_Z$ and $\theta_X$ with the aid of the transducers 30 to 33 and 36. This step is similar to the step 112 except that the transducer 36 is used in place of the transducer 38.

During a step 120, the processing unit 58 samples the electrical signals generated by the transducers during the step 118 and deduces from them the measured values of the angles $\theta_Z$ and $\theta_X$. Then, on the basis of the values of the angle $\theta_Z$ measured during steps 112 and 118, respectively, the unit 58 establishes the value of the components $c_Y$ and $c_X$, respectively. The unit 58 also deduces the value of the component $c_Z$ of the magnetic field to be measured from the measured values of the angles $\theta_X$ and $\theta_Y$ produced during the steps 112 and 118.

Numerous other embodiments of the sensor 2 are possible. For example, the device for modifying the direction of the magnetic moment of the magnet 54 may include a plurality of mechanical stress generators. FIG. 19 represents one such device including the generator 56 and an additional magnetic stress generator 130. The generator 130 is designed to exert a uniaxial mechanical stress on the magnet 54 in a direction different from that exerted by the generator 56. For example, the generator 130 is identical to the generator 56 except that it is offset angularly relative to it, for example by 90°. The magnet 54 is located at the intersection of the beams 60 of the generators 56 and 130. This intersection typically forms with the beams 60 of the generators 56 and 130 a single block of material.

This device is capable of generating a uniaxial mechanical stress in all directions parallel to the substrate plane 4 included within an angular sector from 0 to 90°. This can prove useful for finer adjustment of the direction 55 of the magnetic moment.

The magnetic field source can equally include a permanent magnet the direction of the magnetic moment of which cannot be modified. One such embodiment is shown in FIG. 20. For example, the support 6 from FIG. 20 includes the permanent magnet 54, the mechanical stress generator 56 and an additional permanent magnet 134 deposited directly onto the substrate 6.

In FIG. 20, in the absence of any mechanical stress, the magnetic moments of the magnets 54 and 134 are parallel to the direction X. If the generator 56 modifies the direction 55 of the magnetic moment of the magnet 54 to align it with the direction Y, the magnetic moment of the source is then at an angle of 45° to the direction X, for example. The direction of the magnetic moment of the magnetic field source is in this case the result of combining the directions of the magnetic moments of the magnets 54 and 134. Except for this difference, this variant functions as described above.

Other embodiments of the mechanical stress generator are possible. For example, the generator can be actuated thermally and not with the aid of piezoelectric material. FIG. 21 represents such an embodiment. In this figure, the permanent magnet 54 is deposited on a suspended beam 138 the geometry of which is identical to that of the beam 60, for example. Ends 139 and 140 of this beam are fixed with no degree of freedom to the upper face of the support 6 by means of rigid blocks 144 and 145. The beam 150 is produced in a material having a coefficient of thermal expansion identical to or different from that of the material used to produce the support 6.

A heat source 148 is provided for heating the substrate 6 more than the beam 138. Under these conditions, either the beam 138 or the substrate 6 expands more than the other, which leads to the appearance of a uniaxial mechanical stress in the magnet 54 fixed to a central branch 150 of the beam 138 suspended above the upper face of the support 6.

The magnetic field source is not necessarily a permanent magnet. For example, it can also consist of conductive wires carrying a direct current. FIG. 22 represents one such magnetic field source 160. Here the source 160 includes two electrical conductors 162 and 164 fixed with no degree of freedom to the upper face of the support 6. In this embodiment, the magnet 54 and the stress generator 56 are omitted.

The conductor 162 extends parallel to the axis 14. The conductor 164 extends in a different direction. For example, the conductor 164 here traces out a Z on the upper surface of the support 6, the transverse bar of this Z extending over the majority of the diagonal of the support 6 that is parallel to the axis 12. The horizontal bars of this Z, and only these horizontal bars, are preferably disposed between metal layers electrically connected to ground to form a magnetic screen.

The conductors 162 and 164 are electrically insulated from each other so as to be adapted to be supplied with power alternately. Here the end of each conductor 162, 164 is connected to ground and its opposite other end is connected to a direct current voltage source $V_+$.

The device 56 is replaced by a device 166 adapted to cause a current to flow alternately in the conductors 162 and 164. To this end, the device 166 includes two switches 168, 170. To modify the direction of the magnetic moment of the source 160, the device 166 opens one of the switches 168, 170 and closes the other one. The remainder of the operation of the sensor is identical to that described above.

Accordingly, in this embodiment, the magnetic field source includes first and second conductors electrically insulated from each other and fixed with no degree of freedom to the mobile support, these electrical conductors extending in respective different directions parallel to the substrate plane, and the device for modifying the direction of the magnetic moment includes switches that can be operated to supply power to the first and second electrical conductors alternately.

The magnetic moment of the magnetic field source does not necessarily turn through exactly 90°. The direction of the magnetic moment can turn through an angular value different from 90° but must not turn through a multiple of 180°. In particular, it is not necessary for the direction of the magnetic moment to be parallel to the rotation axes 12 and 14 of the support 6. A simple calculation, such as a change of frame of reference, makes it possible to establish the components $c_X$ and $c_Y$ of the magnetic field to be measured with a source magnetic moment that is not aligned either with the axis 12 or with the axis 14.

The direction of the magnetic moment of the generated magnetic field is not necessarily parallel to the substrate plane. This direction alternatively includes at least one non-zero component in the substrate plane and possibly also a non-zero component in the vertical direction The magnetic field source may also be a thin layer of soft anisotropic magnetic material, i.e. one having a magnetic moment measurable only when it is exposed to an exterior magnetic field. These materials typically have a coercitive field less than 10 or 70 A.m$^{-1}$. This material is a ferromagnetic material, for example. The ferromagnetic material is typically an amorphous composition containing iron or iron and cobalt with one or more amorphization elements such as boron, nitrogen or carbon and one or more substitution elements such as gallium and terbium. In response to a mechanical tensile stress exerted perpendicularly to its preferential magnetization direction, the direction of the magnetic moment turns through 90°. In contrast to the permanent magnet 54 described above, such a ferromagnetic layer has only two stable positions for 0° and 90°. It is possible to go from one of these stable positions to the other by applying a stress greater than 50 MPa and preferably a mechanical stress between 50 and 100 MPa.

The permanent magnet can equally be produced in a single block of material having a sufficient magnetostriction coefficient, typically greater than $10^{-6}$ and advantageously greater than $50.10^{-6}$, rather than a stack of ferromagnetic and anti-ferromagnetic layers. The production of such a permanent magnet using MEMS (Micro Electromechanical System) technology is described for example in: D. P. Arnold et al., "*Permanent Magnets for MEMS*", Journal of Microelectromechanical systems, volume 18, no 6, December 2009.

The magnetic field source can also be a block of soft isotropic magnetic material. This ferromagnetic material will for example be Metglas® that has a positive or negative magnetostriction coefficient $\lambda_s$ according to its composition.

The magnetic field source can also be produced with the aid of a block of magnetostrictive material having a negative magnetostriction coefficient $\lambda_s$. In this case, its preferential magnetization direction must be parallel to the direction of the mechanical tensile stress to cause the direction of its magnetic moment to turn.

The mechanical stress generator can also be designed to exert a uniaxial compression mechanical stress instead of a uniaxial tension mechanical stress. In this case, the preferential magnetization directions described above must be turned through 90° parallel to the substrate plane.

The mechanical stress generator can also be produced differently. For example, it can be a generator generating a mechanical stress with the aid of electrostatic deformation.

The transducers for measuring the rotation about the axes 10, 12, and 14 can be produced differently. For example, the transducers may be replaced by piezoelectric transducers. To this end, beams of piezoelectric material that extend parallel to the beams of the mechanism 16 are provided. Like the beams of the mechanism 16, these beams are anchored by one of their ends to the frame and by the other end to the substrate, in order to measure the rotation of the frame about the axis 10. The beams can equally be anchored by one of their ends to the frame and by the other end to the mobile support 6, to measure the rotation of the support 6 about the axis 10. One example of such piezoresistive beams is described for example in the following paper: D. Ettelt et al., "*A new low consumption 3D compass using integrated magnets and piezoresistive nano-gauges*", Transducers 2011 Conference, Beijing, China.

Alternatively, an optical transducer is used to measure the rotation of the support 6.

Alternatively, the beams 20a, 20b and 22a, 22b are produced differently. For example, it is not necessary for these beams to connect the corners of the frame 18 to the corners of the cavity 26 or the corners of the support 6 to the corners of the frame 18. The beams can be anchored between vertical and parallel faces of the support 6, the frame 18 and the walls 28.

Other geometries of the frame 18 are possible. For example, the central opening can be circular.

Alternatively, the control electrodes of the piezoelectric material beam are placed differently. For example, they can be interdigitated and distributed over the whole of the surface of the beam.

If it is required only to measure the components $c_X$ and $c_Y$ of the magnetic field in the substrate plane, the degree of freedom in rotation about the horizontal axes may be omitted. For example, the beams 20a, 20b and 22a, 22b are then conformed so as not to be deformed in torsion.

The invention claimed is:

1. An apparatus comprising a magnetic field vector sensor, said magnetic field vector sensor comprising a fixed substrate extending essentially parallel to a substrate plane, a mobile support, said mobile support being mobile relative to said fixed substrate and rotatable about at least a vertical rotation axis perpendicular to said substrate plane, a magnetic field source for generating a magnetic field having a magnetic moment in a direction that is not perpendicular to said substrate plane, said magnetic field source being fixed to said mobile support with no degree-of-freedom so as to exert a mechanical torque on said mobile support about said vertical rotation axis when a magnetic field to be measured is present, said magnetic field to be measured being non-collinear with said magnetic moment, at least one transducer adapted to convert said mechanical torque exerted on said mobile support about said vertical rotation axis into a signal representative of an amplitude of a component of said magnetic field to be measured along a measurement axis contained in said substrate plane, wherein said magnetic field source comprises a magnetostrictive permanent magnet for generating said magnetic field having said magnetic moment, said magnetic moment having a direction that varies as a function of mechanical stress exerted on said magnetostrictive permanent magnet, and wherein said magnetic field vector sensor further comprises a controllable device adapted to reversibly modify said direction of said magnetic moment of said magnetic field generated by said magnetic field source, said controllable device comprising a stress generator adapted to vary said mechanical stress exerted on said magnetostrictive permanent magnet to vary said direction of said magnetic moment thereof.

2. The apparatus of claim 1, wherein said stress generator is adapted to exert traction on said magnetostrictive permanent magnet in a stretching direction, and wherein said magnetostrictive permanent magnet has a positive magnetostriction coefficient and, in absence of mechanical stress on said magnetostrictive permanent magnet, said direction of said magnetic moment thereof is perpendicular to said stretching direction to within plus or minus 10°.

3. The apparatus of claim 1, wherein said stress generator is adapted to exert traction on said magnetostrictive permanent magnet in a stretching direction, wherein said magnetostrictive permanent magnet has a negative magnetostriction coefficient and wherein, in absence of mechanical stress on said magnetostrictive permanent magnet, said direction of said magnetic moment of said magnetostrictive permanent magnet is parallel to said stretching direction to within plus or minus 10°.

4. The apparatus of claim 1, wherein said stress generator is adapted to exert compression on said magnetostrictive permanent magnet in a compression direction, wherein said magnetostrictive permanent magnet has a positive magnetostriction coefficient and wherein, in absence of mechanical stress on said magnetostrictive permanent magnet, said direction of said magnetic moment thereof is parallel to said compression direction.

5. The apparatus of claim 1, wherein said stress generator is adapted to exert compression on said magnetostrictive permanent magnet in a compression direction, wherein said magnetostrictive permanent magnet has a negative magnetostriction coefficient and wherein, in absence of mechanical stress, said magnetic moment has a direction perpendicular to said compression direction.

6. The apparatus of claim 1, wherein said stress generator comprises a beam having a central branch suspended above said substrate, said beam comprising ends anchored with no degree-of-freedom relative to said substrate, at least one of said ends comprising a piezoelectric material, and electrodes adapted to apply an electric field to said piezoelectric material to generate a uniaxial stress in said central branch of said beam, and wherein said magnetostrictive permanent magnet is fixed with no degree-of-freedom to said central branch of said beam.

7. The apparatus of claim 1, wherein said stress generator comprises a beam having a central branch suspended above said substrate, said beam comprising ends anchored with no degree-of-freedom relative to said substrate, and a heating element adapted to create an expansion difference between said beam and said substrate, wherein said magnetostrictive permanent magnet is fixed with no degree-of-freedom relative to said central branch of said beam.

8. The apparatus of claim 1, wherein said magnetic field vector sensor comprises an articulated mechanism, said articulated mechanism comprising a mobile frame rotatable about a rotation axis parallel to said substrate plane, a first set of beams connected mechanically at one end to said substrate and at opposite ends to said mobile frame to suspend said mobile frame above said substrate, said beams extending parallel to a first transverse axis perpendicular to said vertical axis and being elastically deformable in flexing and in torsion in such a manner as to enable movement in rotation of said frame about said first transverse axis and said vertical axis, a second set of beams connected mechanically at one end to said mobile support and at opposite ends thereof to said mobile frame to suspend sad mobile support above said substrate, said second set of beams extending parallel to a second transverse axis perpendicular to said first transverse axis and to said vertical axis and being elastically deformable in flexing and in torsion in such a manner as to enable movement in rotation of said support about said second transverse axis and said vertical axis.

9. The apparatus of claim 8, wherein said magnetic field vector sensor is adapted to cause said direction of said magnetic moment of said generated magnetic field to turn reversibly between a position in which a direction of said magnetic moment is parallel to said first transverse axis and a position in which a direction of said magnetic moment is parallel to said second axis.

10. A method of measuring a magnetic field using a magnetic field vector sensor that comprises a fixed substrate extending essentially parallel to a substrate plane, a mobile support, said mobile support being mobile relative to said fixed substrate and rotatable about at least a vertical rotation axis perpendicular to said substrate plane, a magnetic field source for generating a magnetic field having a magnetic moment in a direction that is not perpendicular to said substrate plane, said magnetic field source being fixed to said mobile support with no degree-of-freedom so as to exert a mechanical torque on said mobile support about said vertical rotation axis when a magnetic field to be measured is present, said magnetic field to be measured being non-collinear with said magnetic moment, at least one transducer adapted to convert said mechanical torque exerted on said mobile support about said vertical rotation axis into a signal representative of an amplitude of a component of said magnetic field to be measured along a measurement axis contained in said substrate plane, wherein said magnetic field source comprises a magnetostrictive permanent magnet for generating said magnetic field having said magnetic moment, said magnetic moment having a direction that varies as a function of mechanical stress exerted on said magnetostrictive permanent magnet, and wherein said magnetic field vector sensor further comprises a controllable device adapted to reversibly modify said direction of said magnetic moment of said magnetic field generated by said magnetic field source, said controllable device comprising a stress generator adapted to vary said mechanical stress exerted on said magnetostrictive permanent magnet to vary said direction of said magnetic moment thereof, said method comprising causing said magnetic field source to generate a magnetic field having a first magnetic moment in a first direction not perpendicular to said substrate plane, measuring a physical magnitude representative of said torque exerted on said mobile support about said vertical axis when said magnetic moment of said magnetic field generated by said source is in said first direction, controlling said controllable device to align a direction of said magnetic moment of said magnetic field generated by said source in a second direction not perpendicular to the substrate plane and different from the first direction, then measuring a physical magnitude representative of torque exerted on said mobile support about said vertical axis when said magnetic moment of said magnetic field generated by said source is in the second direction, and establishing a value of two components of said measured magnetic field contained in the substrate plane from measurements of said physical magnitudes representative of torque exerted on said mobile support about said vertical axis when said magnetic moment of said magnetic field generated by said source is in the second direction and a physical magnitude representative of said torque exerted on said mobile support about said vertical axis when said magnetic moment of said magnetic field generated by said source is in said first direction.

* * * * *